United States Patent [19]
Mukai

[11] Patent Number: 5,982,695
[45] Date of Patent: Nov. 9, 1999

[54] SEMICONDUCTOR MEMORY

[75] Inventor: Hideo Mukai, Tokyo, Japan

[73] Assignee: Kabushiki Kaisha Toshiba, Kawasaki, Japan

[21] Appl. No.: 09/064,047

[22] Filed: Apr. 22, 1998

[30] Foreign Application Priority Data

Apr. 23, 1997 [JP] Japan ..................................... 9-106141

[51] Int. Cl.$^6$ .............................. G11C 7/00; G11C 11/24
[52] U.S. Cl. .................... 365/226; 365/149; 365/189.11; 365/210; 365/203
[58] Field of Search .............................. 365/226, 189.11, 365/149, 210, 203, 202

[56] References Cited

U.S. PATENT DOCUMENTS

| | | | |
|---|---|---|---|
| 4,907,200 | 3/1990 | Ikawa et al. | 365/210 X |
| 5,703,814 | 12/1997 | Nishimura et al. | 365/189.11 X |
| 5,719,814 | 2/1998 | Ishikawa | 365/149 X |
| 5,822,253 | 10/1998 | Lines | 365/226 X |

Primary Examiner—Huan Hoang
Attorney, Agent, or Firm—Banner & Witcoff, Ltd.

[57] ABSTRACT

A semiconductor memory includes memory cell array, a voltage boosting circuit, a potential generating circuit and a sense amplifier. The memory cell array is composed of a matrix arrangement of memory cells. Each memory cell is composed of a storage device which is selectively controlled by a word line control signal and a bit line control signal supplied to a word line and a bit line at a predetermined timing. The voltage boosting circuit boosts a potential on a word line selected by the word line control signal up to a first potential that is higher than an internal power source potential. The potential generating circuit sets the potential of the bit line selected by the bit line control signal. The potential of the bit line is set to a second potential that is higher than a potential that is lower than the first potential by a threshold of the memory cell. The sense amplifier is operated using the second potential as an operating power source. The sense amplifier amplifies a potential difference between a reference bit line and a read bit line to which data stored in the selectively controlled memory cell is transmitted.

21 Claims, 10 Drawing Sheets

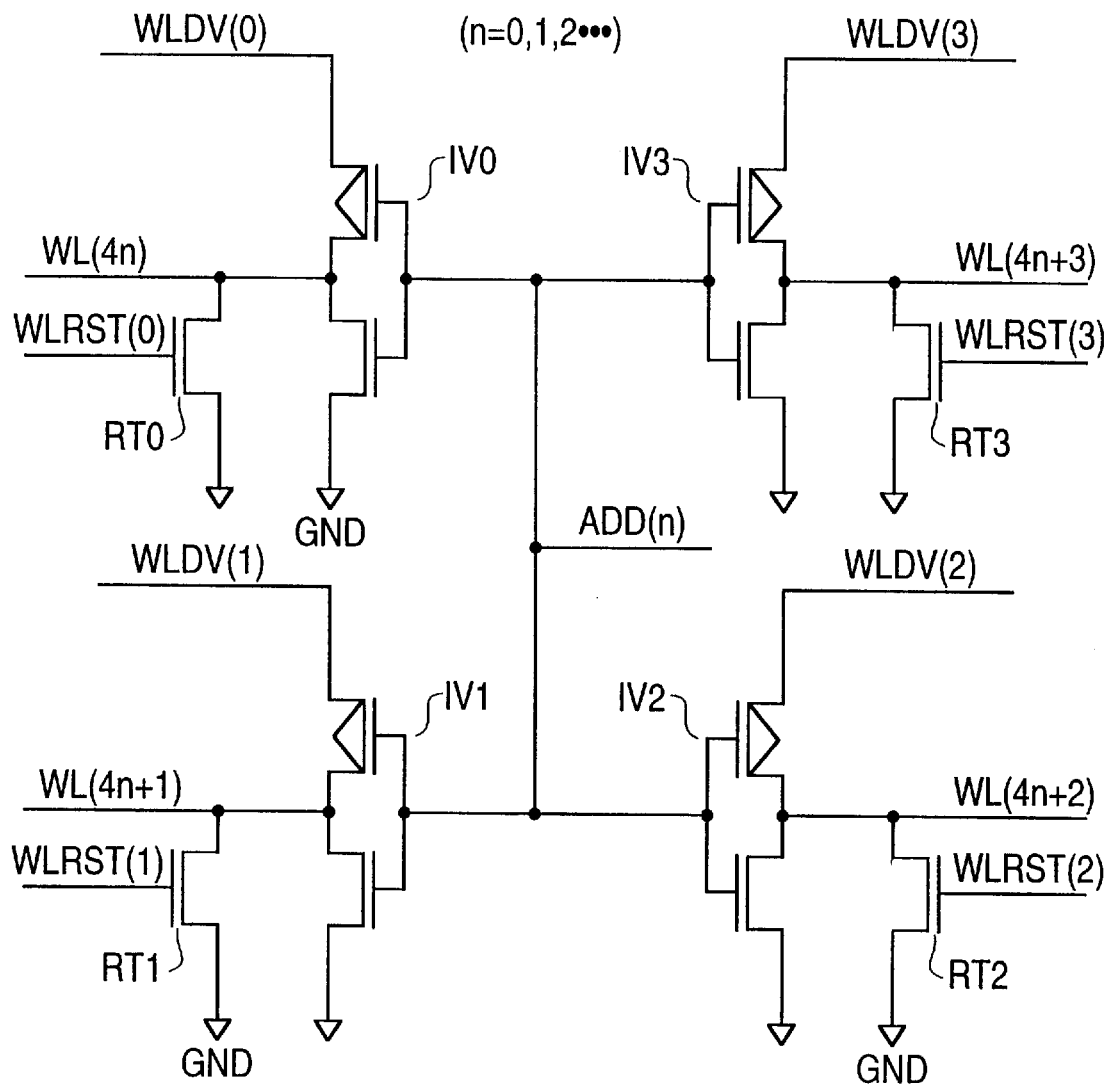

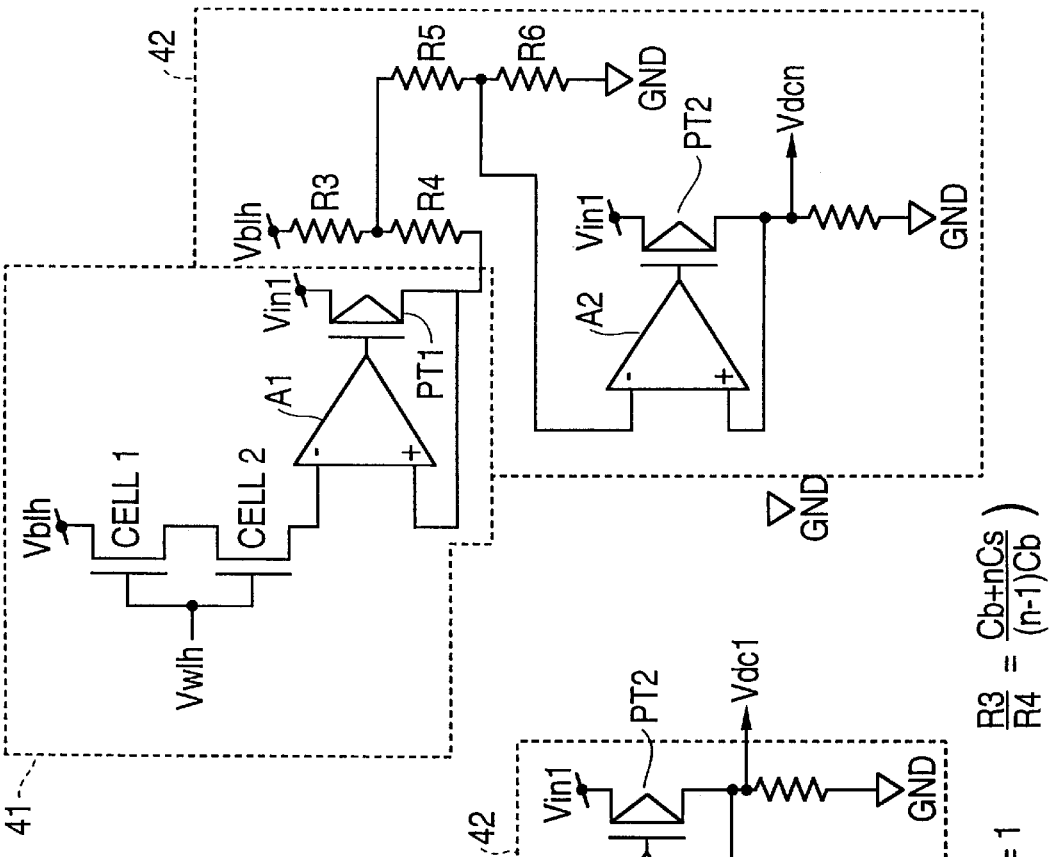
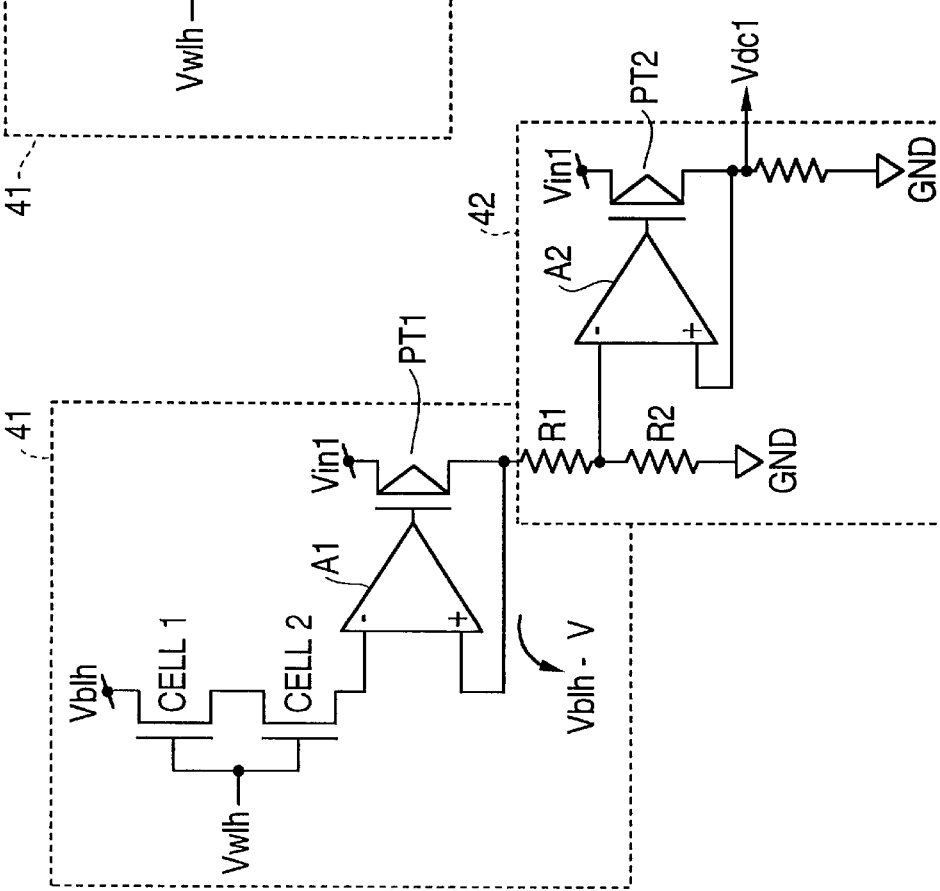
FIG. 13(a)
FIG. 13(b)
$$\frac{R3}{R4} = \frac{Cb+nCs}{(n-1)Cb}$$
$$\left(\frac{R1}{R2} = \frac{R5}{R6} = 1\right)$$

SEMICONDUCTOR MEMORY

FIELD OF THE INVENTION

The present invention particularly relates to a semiconductor memory which requires a low-voltage operation and a high speed.

BACKGROUND OF THE INVENTION

In a semiconductor memory, owing to the reduction of voltage in a system, the importance is how the semiconductor memory is operated in such a manner that a data sense speed is not reduced. It should be here noted that the thinner gate insulating film thickness of a cell transistor of a memory cell allows the voltage to be reduced at a boot level of a word line. However, on the other hand, the allowable minimum threshold voltage of the memory cell is little changed between generations.

FIG. 1 is a waveform chart of the word line and bit line associated with a read operation of a conventional DRAM (Dynamic RAM). When the reduced voltage in a system is not significant in a DRAM, a boot voltage of Vw1h1 of a word line WL is sufficiently high with reference to specifications. In this case, the drop (Vth) of the threshold voltage of the memory cell to be turned on has no adverse effect on the sense speed during the read operation. This will be described below.

In FIG. 1, a possible maximum value Vsn(1)max of a potential at "H" (high) level of a storage node of the memory cell is specified by the word line boot voltage (Vw1h1). That is, this maximum value is a: such a level that the boot voltage Vw1h1 is dropped by the threshold voltage (Vth) of the memory cell.

The "H" potential (Vb1h) of the read bit line can be set so that it may be equal to or less than the "H" potential of the memory cell. Namely, Vsn(1)max≧Vb1h, consequently resulting in Vb1h=Vsn(1) (Vsn(1) corresponds to the value which is determined as the "H" potential of the storage node of the memory cell (≦Vsn(1)max)). Thus, a reference bit line potential (Vb1h/2) for equalizing (or precharging) also supplies a sufficient potential to exhibit driving capability in a sense amplifier, which makes a high-speed read operation possible (in equations in the drawings, Cb denotes a bit line capacity and Cs denotes a storage capacity of the memory cell).

That is, the bit line potential on the side of the sense amplifier is linked to the storage node of the memory cell having the potential Vsn(0) or Vsn(1) corresponding to holding data. The bit line potential on the side of the sense is changed from an equalizing potential (Vb1h/2) into a sense potential (VBL(0) or VBL(1)). Here is shown that the potential of the storage node linked to the bit line is also changed into the sense potential. After that, this sense potential is sense-amplified, compared with the reference bit line potential, that is, Vb1h/2, whereby the sense potential is then read as memory cell data.

The operation of the sense amplification will be simply described below. FIG. 3 is a circuit diagram of the sense amplifier. In the drawing, it is assumed that BL denotes a sense potential VBL(1) and /BL denotes an equalizing potential 1/2Vb1h. In this state, a sense amplifier drive line /SAN is changed from 1/2Vb1h into 0 V. Then, since the gate potential of an NMOS transistor Q2 is higher than that of an NMOS transistor Q1, the current driving rate of the NMOS transistor Q2 is higher than that of the NMOS transistor Q1. Therefore, the potential of /BL is reduced and becomes equal to the potential 0 V of /SAN. On the other hand, when the sense amplifier drive line SAP is changed from 1/2Vb1h into Vb1h, since the gate potential of a PMOS transistor Q3 is lower than that of a PMOS transistor Q4, the current driving rate of the PMOS transistor Q3 is higher than that of the PMOS transistor Q4. Therefore, the potential of SL is increased and becomes equal to the potential Vb1h of SAP.

In the above-described DRAM, a potential difference is made between the "L" potential Vsn(0) and the "H" potential Vsn(1) in the storage node of the memory cell where this potential difference is provided such as set sense speed at which sense data is not hindered at the time of read the memory cell. Therefore, in general, the "H" potential (Vb1h) of the bit line during read has a specification in which it is set equally to the "H" potential of the memory cell without any trouble.

However, in the case of the DRAM in which the voltage is considerably reduced in the system, as illustrated by the waveform chart shown in FIG. 2, the drop (Vth) of the threshold voltage of the memory cell has an adverse effect on the sense speed at the time of read. Next, this will be described below.

In FIG. 2, a boot voltage Vw1h2 of the word line WL is set so that it may be still lower than the boot voltage Vw1h1 of FIG. 1. Due to the same effect of the drop (Vth) of the threshold voltage of the memory cell as described above, a possible maximum value Vsn(1)max of the "H" potential of the memory cell is also reduced. As shown in FIG. 2, the "H" potential (Vb1h) of the bit line is generally set so that it may be equal to or less than the maximum value Vsn(1)max of the "H" potential of the memory cell. Therefore, the reference bit line potential (Vb1h/2) is also lower than the reference bit line potential of FIG. 1.

As a result, the sense speed is reduced at the time of read. That is, the potential (Vb1h) of an operating power source supplied to the sense amplifier shown in FIG. 3, the reference bit line potential Vb1h/2 and the sense potential (VBL(0) or VBL(1)) of the bit line are at low level as a whole. Thus, since the potential difference between VBL(1) and Vb1h/2 and the potential difference between VBL(0) and Vb1h/2 are reduced, due to the difference between MOS transistors Q1 and Q2 in current driving capability, the sense operation is prone to a faulty operation. Moreover, the reduction of the reference bit line potential causes the decrease of the potential between the gate and source of the MOS transistor in the sense amplifier. Consequently, the driving capability of a MOS transistor in the sense amplifier is deteriorated and thus the amplification is slowly operated.

Accordingly, This is feared that reliability is considerably reduced in the read operation in a sense system circuit.

SUMMARY OF THE INVENTION

In consideration of the above-described conditions, it is an object of the present invention to provide a semiconductor memory which achieves both of the reduction of voltage and the high-speed operation in a system.

To achieve the above object, the present invention provides a semiconductor memory comprising, a memory cell array; voltage decreasing means for generating an internal power source potential by decreasing the voltage of an external power source; voltage boosting means for generating a first potential which is higher than the internal power source potential; and a bit line high potential generating circuit for generating, from the internal power source potential, a second potential which is higher than the potential been lower compared with the first potential by a portion of a threshold voltage of a memory cell in the memory cell array.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which:

FIG. 7 is a circuit diagram showing a word line drive circuit;

FIG. 13 is a circuit diagram of the circuit for generating potentials Vdc1 to Vdcn shown in FIG. 11.

DETAILED DESCRIPTION OF PREFERRED EMBODIMENTS

Embodiments of the present invention will be described in detail with reference to the drawings.

Figure 4:
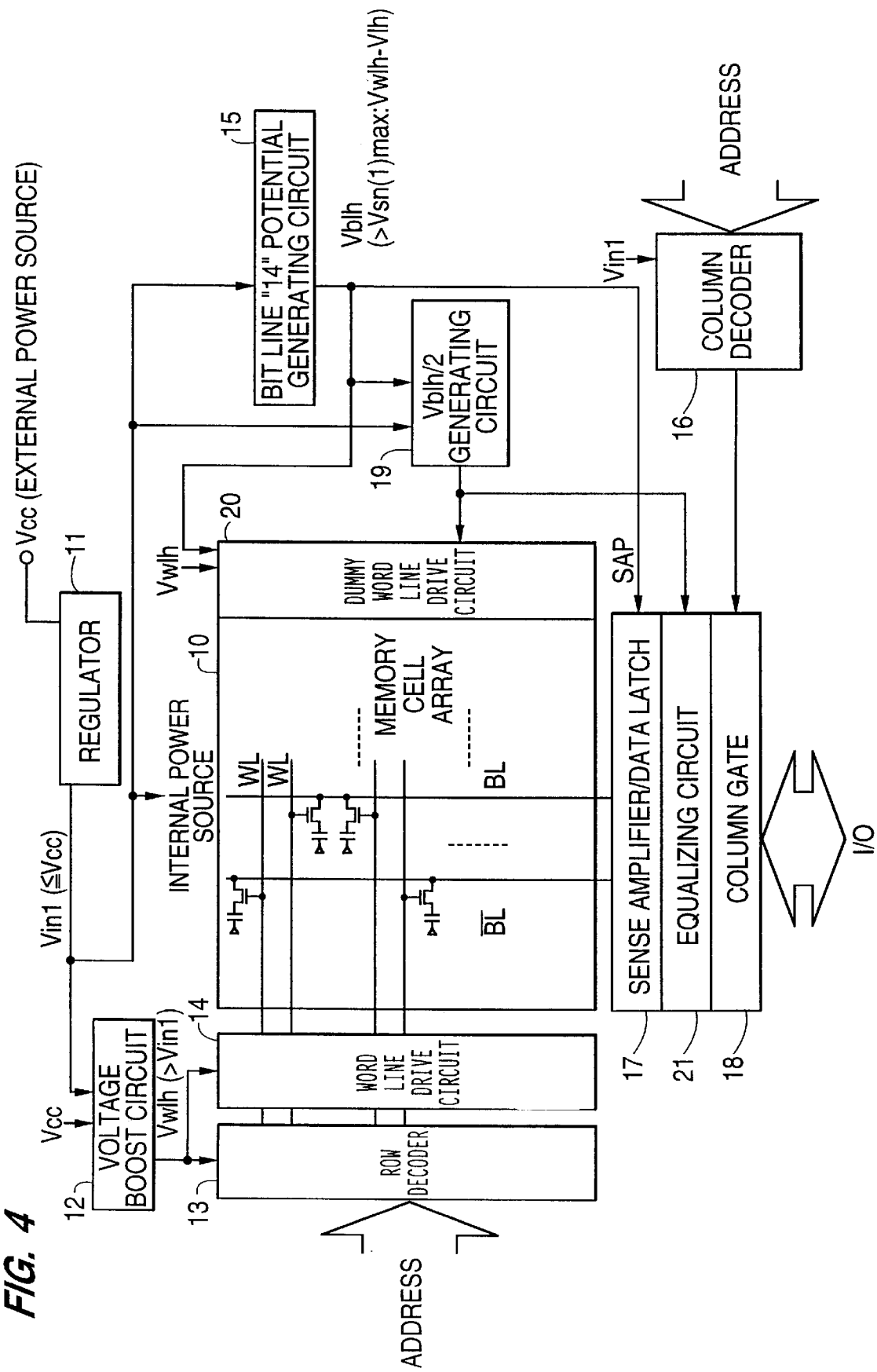
FIG. 4 is a block diagram showing the main portion of DRAM according to a first embodiment of the present invention.

FIG. 4 is a block diagram showing the main portion of DRAM according to a first embodiment of the present invention. A memory cell array 10 is composed of a matrix arrangement of memory cells which are selectively controlled by supplying a control signal to a word line WL and a bit line BL at a predetermined timing. A regulator 11 decreases a voltage of an external power source $V_{cc}$ and generates an internal power source potential Vint at which a memory system is stabilized.

A voltage boost circuit 12 generates a row-system high potential Vw1h (that is the same as a high potential $V_{pp}$) which is higher than the potential Vint. This potential Vw1h serves as an operating power source for a row decoder 13 and a word line drive circuit 14. A bit line "H" (high level) potential generating circuit 15 generates a "H" potential Vb1h of the bit line of this memory system by the use of the potential Vint. This potential Vb1h is higher than the potential which is lower in comparison with the potential Vw1h by the threshold voltage Vth of the memory cell in the memory cell array 10. In other words, as can be also seen from FIG. 5, this potential Vb1h is higher than the "H" potential of a storage node of the memory cell, that is, a possible maximum value Vsn(1)max of the potential at "H" (high) level of the memory cell which emerges as one storage data. This potential Vb1h serves as the operating power source for a sense amplifier/data latch 17. A column decoder 16 is controlled by the potential Vint, and its decode signal controls the transmission of signal between an external input/output I/O and the memory cell array 10 through a column gate 18.

A Vb1h/2 generating circuit 19 receives the potentials Vb1h and Vint and generates an intermediate potential (Vb1h/2) of the potential Vb1h. This potential Vb1h/2 is supplied to a dummy word line drive circuit 20 and an equalizing circuit 21.

Figure 3:
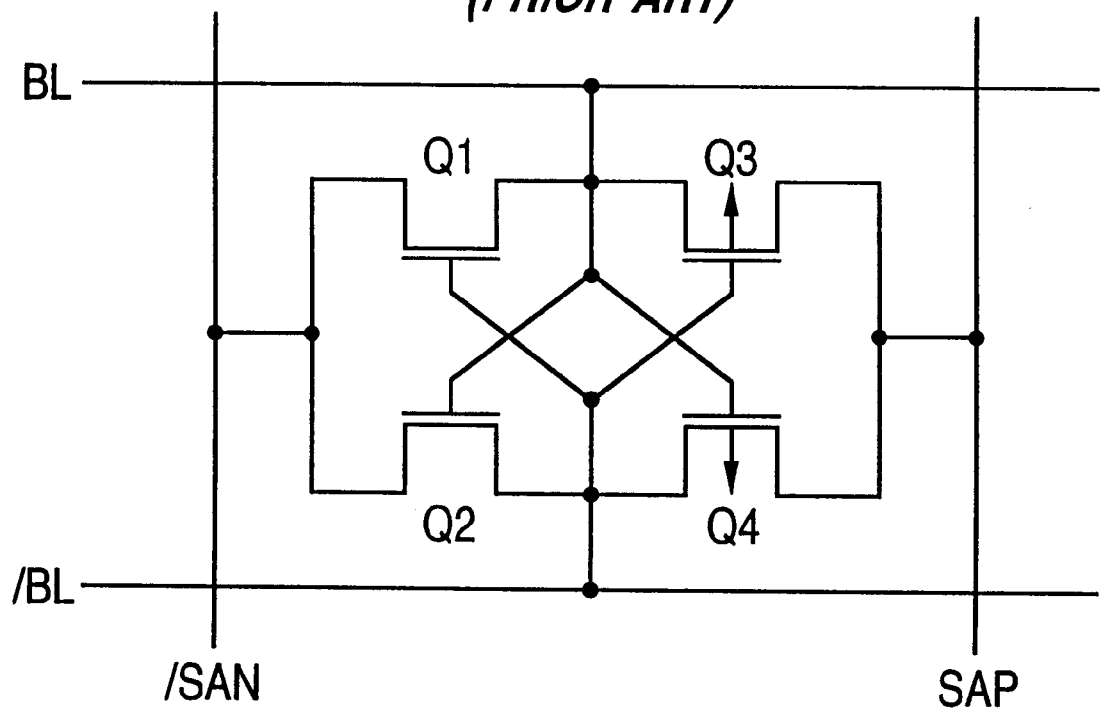
FIG. 3 is a circuit diagram of a sense amplifier.

According to the above-mentioned constitution, a system to which the "H" potential of the memory cell belongs differs from a system to which the "H" potential of the bit line belongs. Thus, a reference bit line potential (Vb1h/2) can be set so that it may be higher than a half of the "H" potential of the memory cell. Therefore, it is possible to solve the problem of the conventional reference bit line potential in which, owing to the increase of the potential between a gate and source of a MOS transistor in the sense amplifier shown in FIG. 3, the driving capability of MOS transistor in the sense amplifier, and the amplifying action of the sense amplifier is getting slower. In other words, since the operating power source for the sense amplifier/data latch 17 is set more highly than the "H" potential of the memory cell and the reference potential of the latch node of the sense amplifier/data latch 17 is equal to the above-described reference bit line potential (Vb1h/2), this prevents the failure of the high-speed read operation.

The first embodiment has the following problem. When the bit line "H" potential is set more highly than the "H" potential of the memory cell in order to increase the data sense speed, bit line read signals at "H" and "L" levels are unequal to each other.

Figure 5:
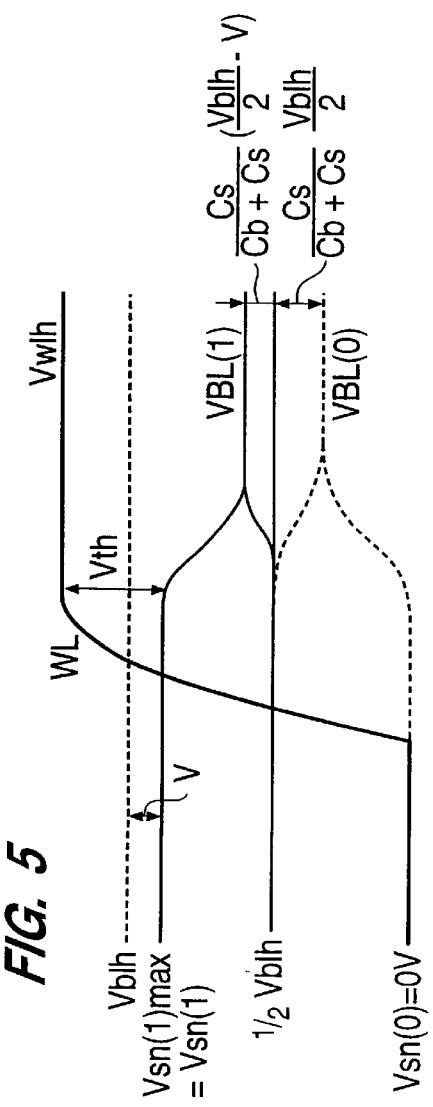
FIG. 5 is a waveform chart of the mode in which bit line read signals at "H" and "L" levels are unequal to each other.

That is, as shown by a waveform chart of FIG. 5, since the "H" potential of the memory cell is lower than the bit line "H" potential and both of the "L" potential of the memory cell and the bit line "L" potential are equal to 0 V, the difference between the sense potential VBL(1) and the reference bit line potential Vb1h/2 at "H" level of the bit line is smaller than the difference between the sense potential VBL(0) and the reference bit line potential Vb1h/2 at "L" level of the bit line. The sum of both the changes, by which the amount of read signal is al "L" level or less, is constant at all times according to the law of charge conservation. Thus, in the bit line, the amount of signal charge for read the "H" level is different from the amount of signal charge for read the "L" level.

This will be qualitatively described. Assuming that Cb denotes a capacity of the bit line, Cs denotes a capacity of the storage node of the memory cell, Vp1 denotes a plate voltage of the memory cell and α denotes the difference between Vb1h/2 and VBL(0), the following equation is established according to the law of charge conservation.

$$Cs(0-Vp1)+Cb\cdot Vb1h/2=Cs(Vb1h/2-\alpha-Vp1)+Cb(Vb1h/2-\alpha)$$

To find value α from this equation, the following equation is represented.

$$|\alpha|=(Cs/Cb+Cs)\cdot Vb1h/2$$

In the same manner, assuming that β denotes the difference between Vb1h/2 and VBL(1), the following equation is established according to the law of charge conservation.

$$Cs(Vb1h-\Delta V-Vp1)+Cb\cdot Vb1h/2=Cs(\beta+Vb1h/2-Vp1)+Cb(\beta+Vb1h/2)$$

To find value β from this equation, the following equation is represented.

$$\beta=(Cs/Cb+Cs)\cdot(Vb1h/2-\Delta V)$$

In the waveform chart of FIG. 5, the bit line potential on the side of the sense is linked to the storage node of the memory cell having the potential Vsn(0) or Vsn(1) corresponding to holding data. Herein, the potential Vsn(1) is equal to a possible maximum value Vsn(1)max of the "H" potential of the memory cell specified by the word line boot voltage (Vw1h). The potential Vsn(0) is an ground potential of 0 V. The bit line potential on the side of the sense is changed from the equalizing potential (=the reference bit line potential (Vb1h/2)) into the sense potential (VBL(0) or VBL(1)). Here is shown that the potential of the storage node linked to the bit line is also changed into the sense potential. After that, this sense potential is sense-amplified, whereby it is then read as memory cell data.

However, as described above, in the bit line, the amount of signal charge for read the "H" level is less than the amount of signal charge for read the "L" level by a portion of $(Cs/(Cb+Cs))\times\Delta V$, resulting in the inequality. Thus, the data of VBL(1) of the bit line is inverted during the sense amplification, which is feared that a correct read operation is impossible. This leads to the increase of defective product rate.

Therefore, the present invention relates to the dummy word line and dummy cell in the memory cell array, in which an appropriate potential change is provided for the dummy word line during read the data whereby the potential of the reference bit line is adjusted. Alternatively, the appropriate potential is previously provided for the dummy cell and the dummy word line is driven during read the data, whereby the potential of the reference bit line is adjusted so as to realize the equalization of both the amounts of the read signals.

Second and later embodiments of the present invention relate to a circuit system for correcting the inequality between the bit line read signals at "H" level and at "L" level which is caused when the bit line "H" potential Vb1h is set equally to or more highly than the cell "H" voltage Vsn(1) in order to increase the sense speed.

Figure 6:
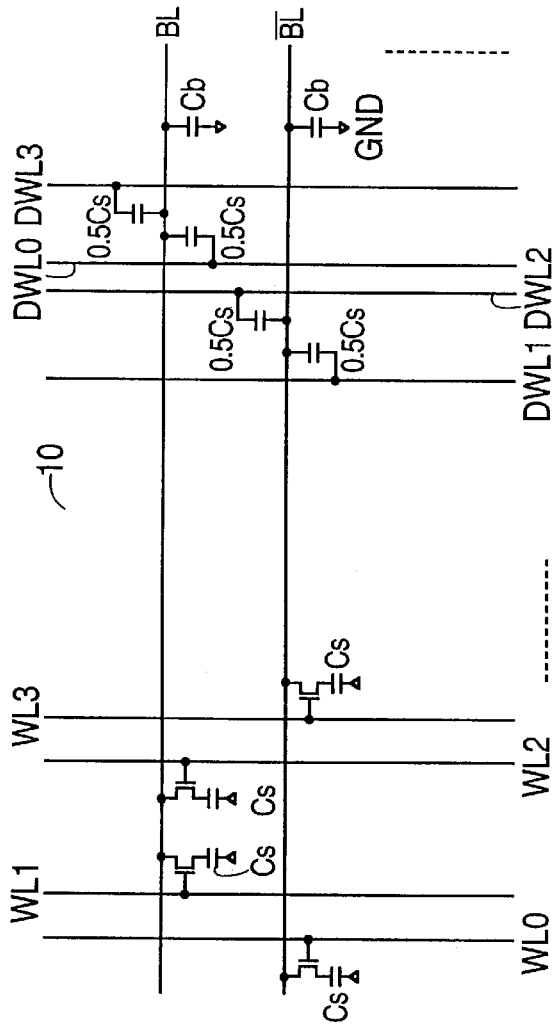
FIG. 6 is a circuit diagram showing a memory cell array section of the DRAM according to a second embodiment of the present invention.

FIG. 6 is a circuit diagram showing a memory cell array section of the DRAM according to the second embodiment of the present invention. This memory cell array section corresponds to the memory cell array 10 of FIG. 4. One dummy cell each is arranged between the bit line BL and two dummy word lines DWL0, DWL3, each dummy cell having a simply coupled capacity corresponding to a half (0.5 Cs) of the capacity of the memory cell. The same one dummy cell each is also arranged between the bit line/BL and two other dummy word lines DWL1, DWL2.

With such a constitution, in the system in which the bit line "H" potential (Vb1h) is set more highly than a possible maximum value (Vsn(1)max=Vsn(1)) of the memory cell "H" potential during the sense amplification in the read operation, the appropriate potential change is provided for the aforementioned four dummy word lines at the time of selecting the word lines, whereby the levels of the bit line read signals at "H" and "L" levels are equalized. In FIG. 5, Vsn(1) is expressed by the following equation (2).

$$Vsn(1)=Vw1h-Vth(cell\cdot h) \qquad (2)$$

Thus, Vsn(1) is represented by Vb1h−ΔV. In the above-described equation (2), Vw1h denotes the word line boot voltage and Vth(cell·h) denotes the threshold voltage of a cell transistor of the memory cell at the time of write at "H" level.

FIG. 7 is a circuit diagram showing the word line drive circuit, which is one of a plurality of drive circuits for four word lines in the word line drive circuit 14 of FIG. 4. A row address signal Add(n) for controlling an active/inactive area of this word line drive circuit is supplied to a common input terminal of CMOS inverters IV0 to IV3. Row address signals WLDV(0) to WLDV(3) for selectively controlling the word lines are supplied to the power sources of the CMOS inverters IV0 to IV3. The outputs of the CMOS inverters IV0 to IV3 are linked to the corresponding word lines. Drive signals WL(4n) to WL(4n+3) are transmitted to the word lines in response to the row address signal Add(n) and the row address signals WLDV(0) to WLDV(3). Transistors RT0 to RT3 connected between the word lines and the ground potential are the transistors for resetting. Row address signals WLRST(0) to WLRST(3) for resecting are supplied to the gates of the transistors RT0 to RT3, so chat the transistors RT0 to RT3 are controlled. When a word line WL1 is selected by the above-described word line drive circuit shown in FIG. 4, if the dummy cell is not detected, the read potential at "H" level of the bit line is expressed by the following equation (3).

$$VBL(1)=Vb1h/2+(Cs/Cb+Cs)(Vb1h/2-\Delta V) \qquad (3)$$

The read potential at "L" level of the bit line is expressed by the following equation (4).

$$VBL(0)=Vb1h/2+(Cs/Cb+Cs)\cdot Vb1h/2 \qquad (4)$$

Both the read signal amounts are not equal to each other (VBL(1)−(Vb1h/2)<(Vb1h/2)−VBL(0)). Herein, Cb denotes the capacity of the bit line and Cs denotes the storage capacity of the memory cell. This inequality between the bit line read signals at "H" level and at "L" level is described above with reference to FIG. 5.

Referring from FIG. 5, the reference bit line potential is equal to Vb1h/2. This value is shifted to (Vb1h/2)−{Cs/(Cb+Cs)}·(Δv/2), whereby both the read signal levels can be equalized. Since this shifted potential is larger than Vsn(1)/2 (because Vsn(1)/2=Vb1h/2−ΔV/2), the bit line read signal level can be highly kept compared to the case of setting Vb1h=Vsn(1), and thus the sense speed can be increased. Moreover, since the drop of the reference bit line potential level can be minimized, the faulty sense operation can be prevented.

In FIG. 6, if the dummy cell capacity is equal to Cs/2 (0.5 Cs in the drawing), for example, when the word line WL1 is selected, the sum of potential changes $\Delta V_{dw11}$ and $\Delta V_{dw12}$ of the two dummy word lines DWL1 and DWL2, each having the dummy cell between it and the reference bit line, is expressed by the following equation (5), and then both the remaining two dummy word lines DWL0, DWL3 are set to floating level, whereby the above-mentioned potential shift of the reference bit line can be realized.

$$\Delta V dw11+\Delta V dw12=-\Delta v \qquad (5)$$

To deduce this equation, defining the shift of the potential of the reference bit line so as to equalize amount of read-out signal of bit lines BL, /BL as α, the law of charge conservation is applied to the bit line /BL:

$$Cb \cdot Vb1h/2+0.5Cs(Vb1h/2-Vdw11)+0.5Cs(Vb1h/2-Vdw12)=\\Cb(Vb1h/2-\alpha)+0.5Cs(Vb1h/2-\alpha-Vdw11-\Delta Vdw11)+\\0.5Cs(Vb1h/2-\alpha-Vdw12-\Delta Vdw12)$$

where Vdw11 denotes the potential of the dummy word line DWL1 and Vdw12 denotes the potential of the dummy word line DWL2. When this equation is solved, the following equation is deduced.

$$\alpha=(-Cs/Cb+Cs)\cdot\{(\Delta Vdw11+\Delta Vdw12)/2\}=(Cs/Cb+Cs)(\Delta v/2)$$

Therefore, the equation (5) is deduced.

Figure 8B:
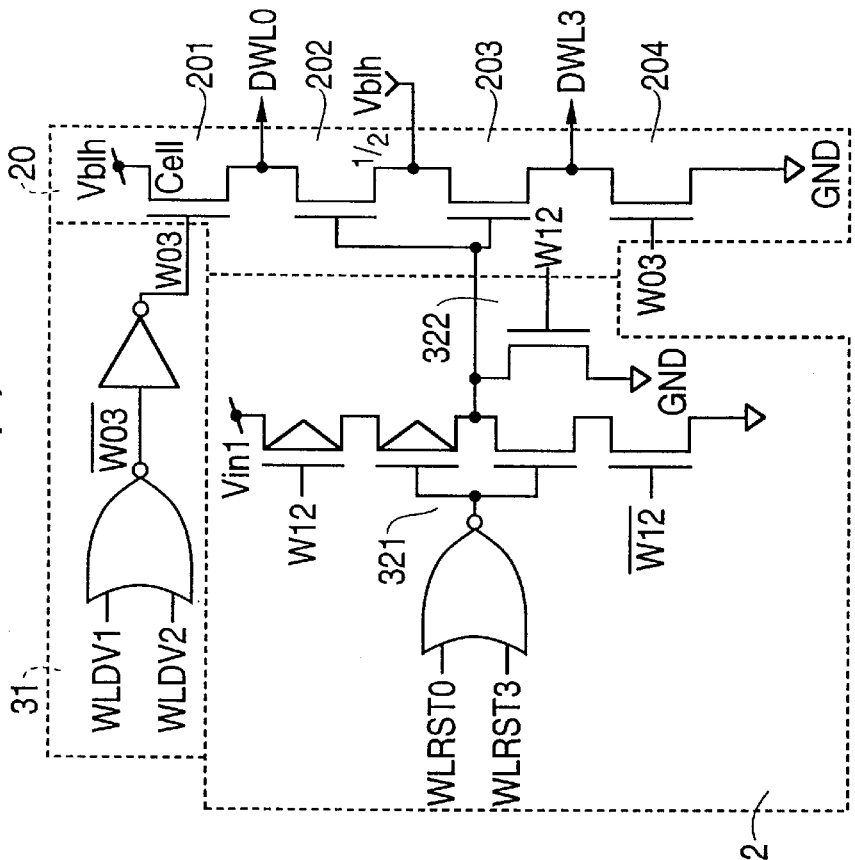
FIG. 8 is a circuit diagram showing a dummy word line drive circuit.
Figure 8A:
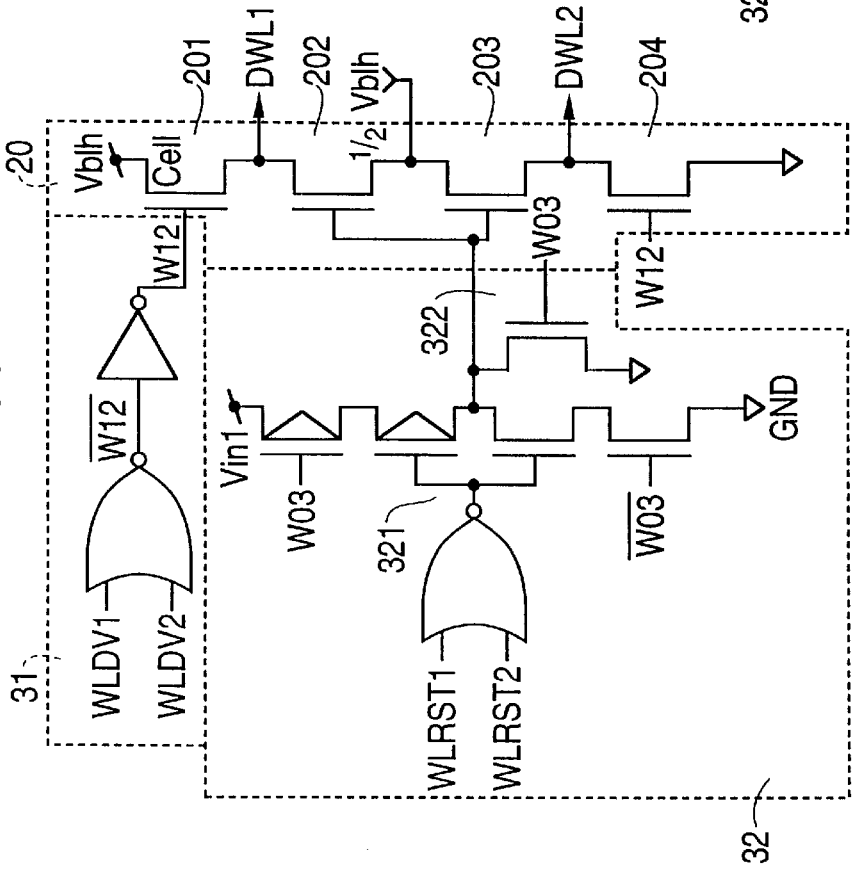
Figure 9:
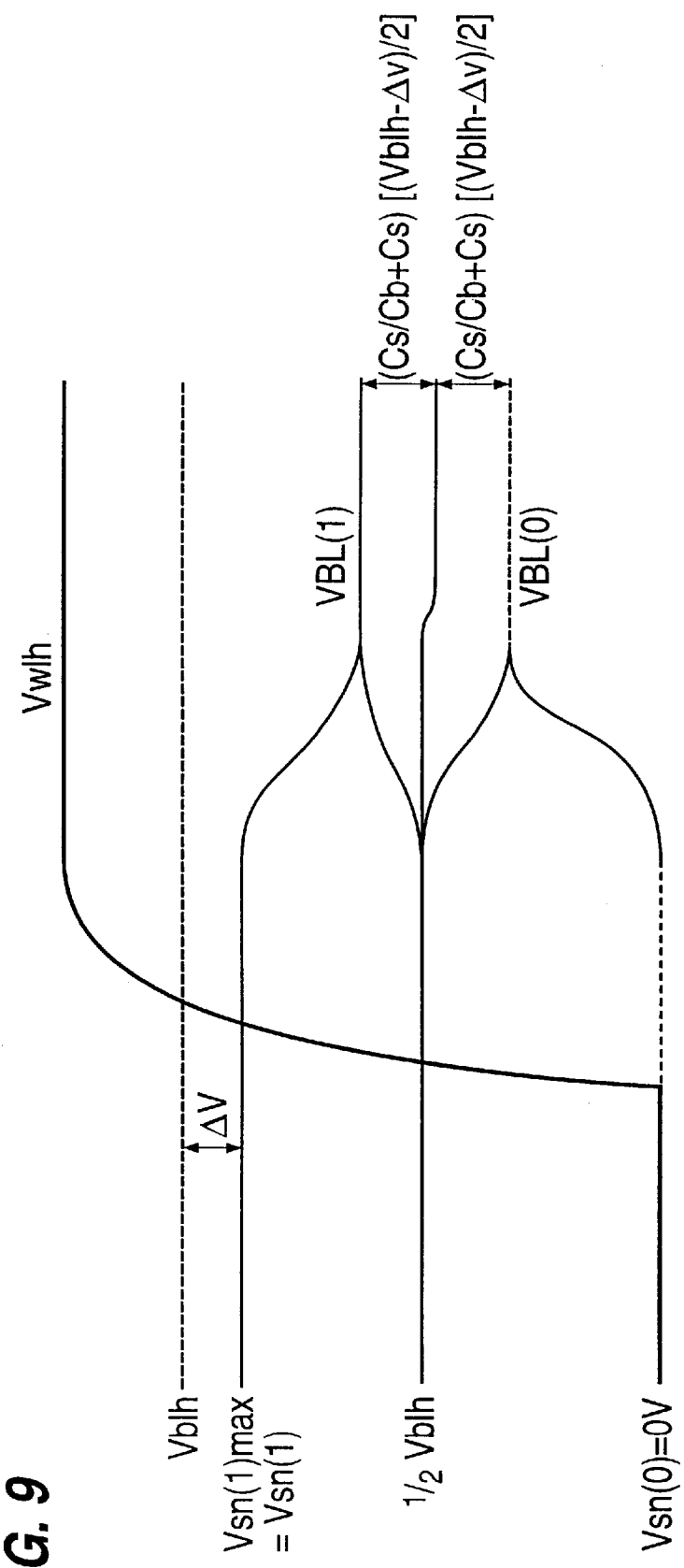
FIG. 9 is a waveform chart of the mode in which the dummy word line drive circuit of FIG. 8 is used so as to thereby remove the inequality between the bit line read signal at "H" level and the bit line read signal at "L" level.

FIGS. 8(*a*) and 8(*b*) are circuit diagrams satisfying the conditions of the above equation (5). That is, there is shown the dummy word line drive circuit for equalizing the "H" and "L" bit line read signal levels. A dummy word line select circuit 31 and a dummy word line precharge control circuit 32 are controlled by supplying the row address signals (whose corresponding reference numerals are shown in FIG. 4, provided () (parentheses) included in the reference numerals are removed in FIG. 8) for selectively controlling the word lines. The outputs of the circuits 31 and 32 control the dummy word line drive circuit 20. The potential Vb1h/2 from the Vb1h/2 generating circuit (19: shown in FIG. 4) is supplied to the dummy word line drive circuit 20.

Figure 1:
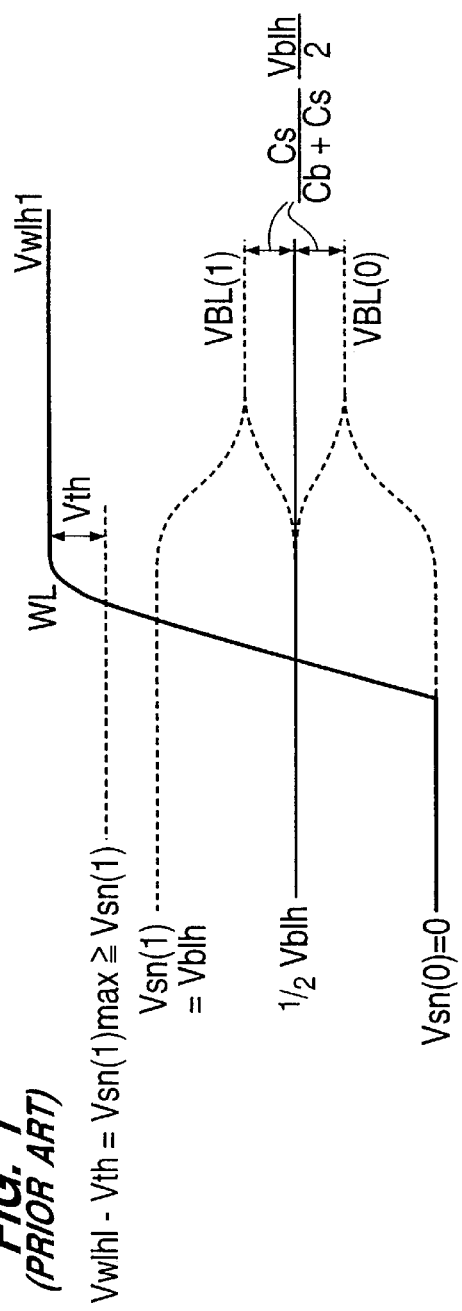
FIG. 1 is a waveform chart of a word line and a bit line associated with a read operation of a conventional DRAM (Dynamic RAM)
Figure 2:
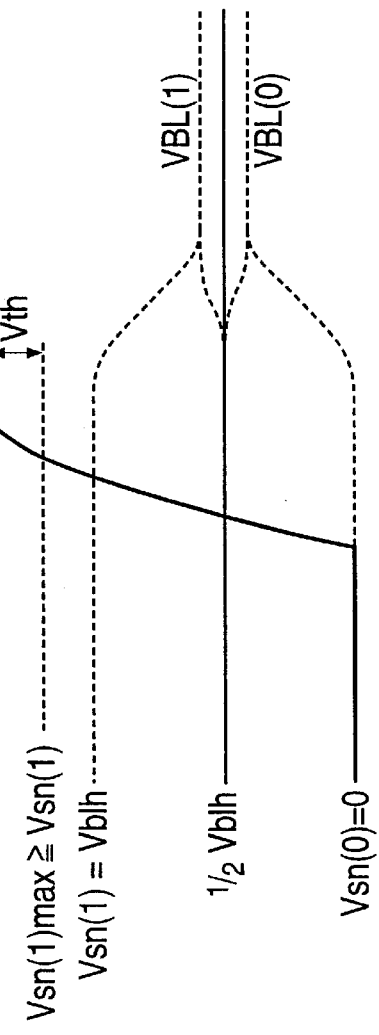
FIG. 2 a waveform chart of the word line and the bit line associated with the read operation of the DRAM, in which a boot voltage of a word line WL is still lower than the boot voltage of FIG. 1 and thus a "H" potential of a storage node of a memory cell is also reduced.

In the circuit diagram of FIG. 8(*a*), in the dummy word line select circuit 31, the row address signals WLDV1, WLDV2 for selectively controlling the word lines are input to a NOR gate, and a signal W12 is generated through the inverter from the NOR gate. The dummy word line select circuit 31 is the same $V_{pp}$ system circuit as the row-system circuit, and the "H" potential of the signal W12 is equal to Vw1h. In the dummy word line precharge control circuit 32, the output of the NOR gate to which the row address signals WLRST1, WLRST2 for resetting are input is received by a clocked inverter 321 controlled by signals W03, /W03 (the signals of the dummy word line select circuit 31 of FIG. 8(*b*) described below), and a precharge signal is output from the clocked inverter 321. The operating power source for the clocked inverter 321 is the potential Vint of FIG. 4. Reference numeral 322 denotes the transistor for turning off. The signal W12 and the precharge signal are supplied to the dummy word line drive circuit 20. The operating power source for the dummy word line drive circuit 20 is the potential Vb1h of FIG. 1. A transistor 201 in which a drain is connected to this potential Vb1h has the same threshold voltage as the memory cell. The threshold voltages of serial transistors 202 to 204 arranged between the transistor 201 and the ground potential are lower than the threshold voltage of the transistor 201. Thus, during the operation, since the gate potentials of the transistors 202 to 204 are sufficiently high, the transistors 202 to 204 are little influenced by the threshold voltage. The above-described precharge signal is supplied to the common gate of the transistors 202 and 203.

The above-described potential Vb1h/2 is supplied to the common drain of the transistors 202 and 203. The signal W12 from the dummy word line select circuit 31 is supplied to the gate of the transistors 201 and 204.

In the circuit diagram of FIG. 8(*b*), in the dummy word line select circuit 31, the row address signals WLDV0, WLDV3 for selectively controlling the word lines are input co the NOR gate, and the signal /W03 is generated through the inverter from the NOR gate. The dummy word line select circuit 31 is the same $V_{pp}$ system circuit as the row-system circuit, and the "H" potential of the signal W03 is equal to Vw1h. In the dummy word line precharge control circuit 32, the output of the NOR gate to which the row address signals WLRST0, WLRST3 for resetting are input is received by the clocked inverter 321 controlled by signals W12, /W12 (the signals of the dummy word line select circuit 31 of FIG. 8(*a*) described above), and the precharge signal is output from the clocked inverter 321. The operating power source for the clocked inverter 321 is the potential Vint of FIG. 4. Reference numeral 322 denotes the transistor for turning off. The signal W03 and the precharge signal are supplied to the dummy word line drive circuit 20. The operating power source for the dummy word line drive circuit 20 is the potential Vb1h of FIG. 1. The transistor 201 in which the drain is connected to this potential Vb1h has the same threshold voltage as the memory cell. The threshold voltages of the serial transistors 202 to 204 arranged between the transistor 201 and the ground potential are lower than the threshold voltage of the transistor 201. Thus, during the operation, since the gate potentials of the transistors 202 to 204 are sufficiently high, the transistors 202 to 204 are little influenced by the threshold voltage. The above-described precharge signal is supplied to the common gate of the transistors 202 and 203. The above-described potential Vb1h/2 is supplied to the common drain of the transistors 202 and 203. The signal W03 from the dummy word line select circuit 31 is supplied to the gate of the transistors 201 and 204.

The circuit operation of FIG. 8 will be described. For example, when the word line WL1 is selected in the memory cell array of FIG. 6, the potential Vdw11 of the dummy word line DWL1 is changed from the bit line equalizing potential (Vb1h/2) into Vb1h−Δv, and the potential Vdw12 of the dummy word line DWL2 is changed from the equalizing potential into the ground potential. At this time, the dummy word lines DWL0, DWL3 are shifted from equalizing potential to floating level. Thus, the reference bit line potential is shifted to (Vb1h/2)−{Cs/(Cb+Cs)}·(Δv/2). It should be noted that Δv has the value represented by the equation (5). As a result, the inequality between the bit line read signals at "H" level and at "L" level is corrected.

Figure 10:
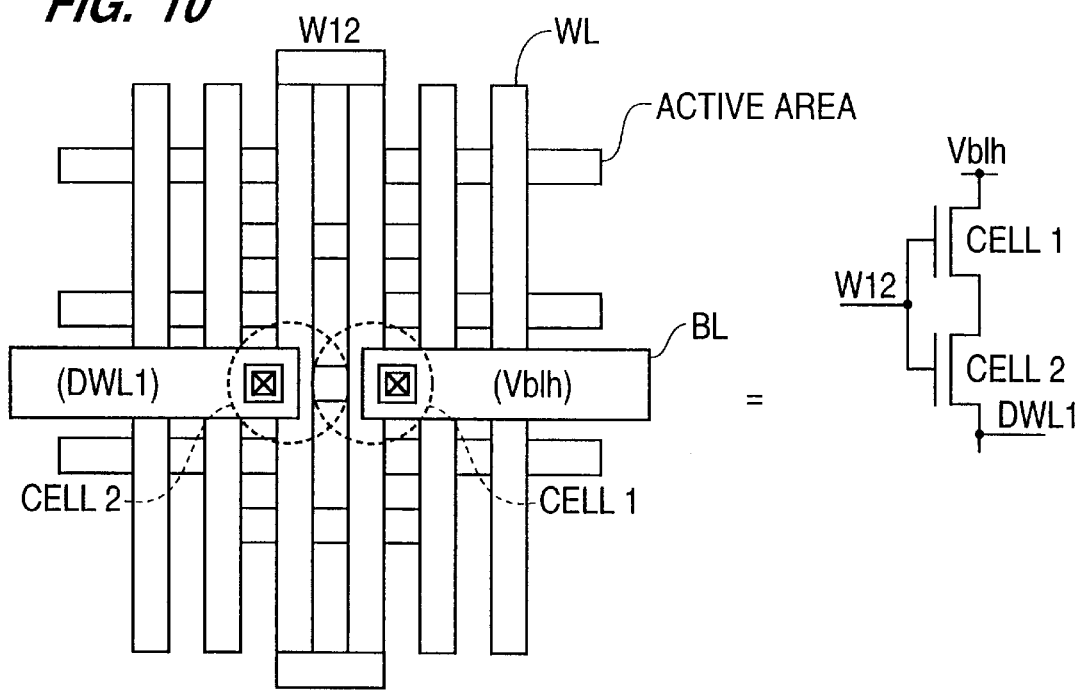
FIG. 10 is a plan view partially showing the structure of the dummy word line drive circuit.

FIG. 10 is a plan view showing an exemplary structure of the transistor 201 of FIG. 8(*a*) having the threshold voltage of the memory cell. The transistor 201 is constituted so that it may be quite identical to the memory cell. In this case, since the transistor is formed of two cells 1 and 2, the transistor 201 is composed of the two cells 1 and 2. This is shown in the circuit diagram, which is shown in the right side of FIG. 10. In the drawing, the cells 1 and 2 are connected in serial to each other, which is equivalent to the transistor 201 of FIG. 8. The transistor 201 of FIG. 8(*b*) is also the same as this constitution.

Figure 11:
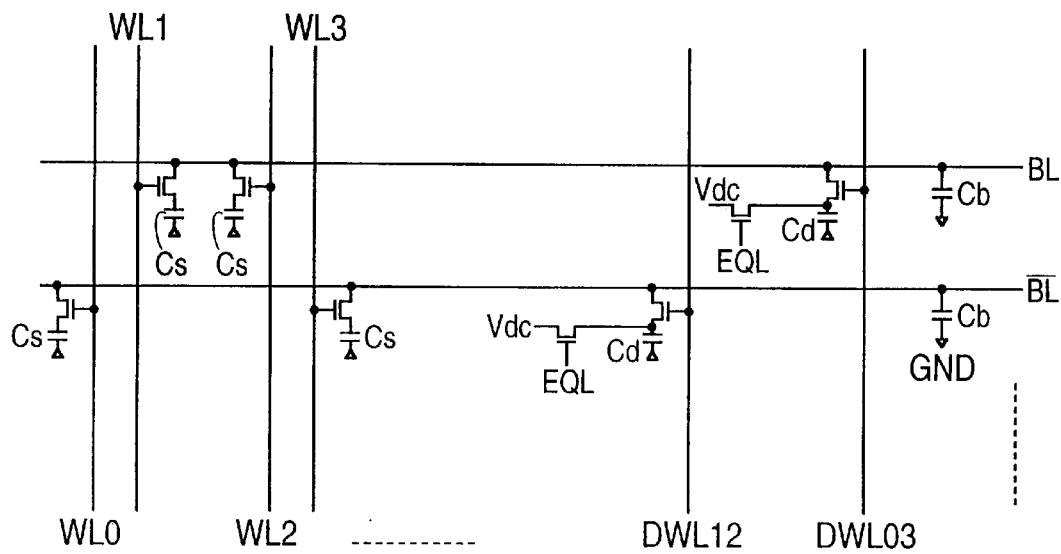
FIG. 11 is a circuit diagram showing the memory cell array section of the DRAM according to a third embodiment of the present invention.

FIG. 11 is a circuit diagram showing the memory cell array section of the DRAM according to a third embodiment of the present invention. This memory cell array section corresponds to the memory cell array 10 of FIG. 4. One dummy cell each of write type capacity Cd(=Cs) having the cell transistor whose gate is connected to the dummy word lines (DWL12, DWL03) is connected to the signal read bit line and the reference bit line.

With such a constitution, in the system in which the bit line "H" potential (Vb1h) is set more highly than a possible maximum value (Vsn(1)max) of the memory cell "H" potential specified by the word line boot voltage during the sense amplification in the read operation, the precharge potential is provided during equalizing and the dummy word line corresponding to the reference bit line is also driven during selecting the word line, whereby the amounts of the bit line read signals at "H" and "L" levels are equalized.

In FIG. 11, the setting of the potential associated with the memory cell is accomplished in the same manner as the second embodiment. In the third embodiment, the dummy cell capacity Cd is equal to the memory cell capacity Cs, and the write precharge potential Vdc is expressed by the following equation (6).

$$(1/2)Vdc = (1/2)Vdc1 = (Vb1h - \Delta v) \quad (6)$$

Figure 12:
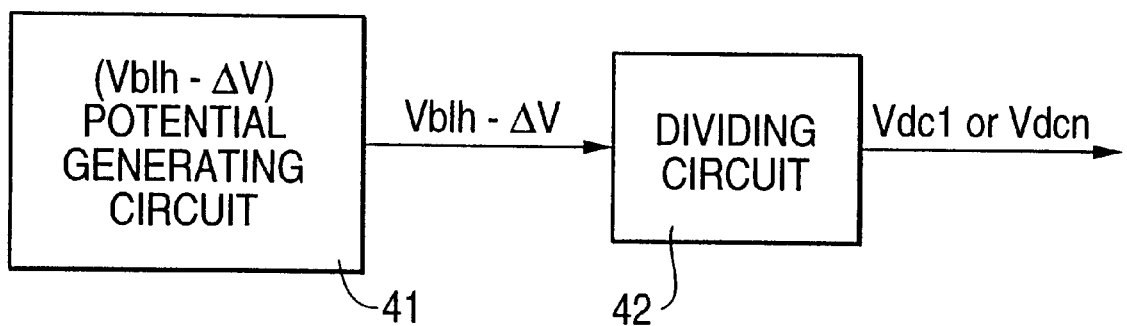
FIG. 12 is a block diagram showing a power source generating circuit applied to the present invention.

The above-mentioned potential Vdc1 is generated in a power source generating circuit shown in FIG. 12. That is, the potential Vdc1 is achieved in the circuit for dividing the potential (Vb1h−Δv) (shown in detail in FIG. 13(a)). The dummy word line is formed so that it may be driven by the constitution of FIG. 4 in the same manner as the word line. For example, the dummy word line DWL12 is also driven when the word line WL1 is driven, while the dummy word line DWL03 keeps the ground potential. Thus, at the time of read the signal, the reference bit line potential VBL.ref is shifted to the value represented by the following equation (7) in the same manner as the second embodiment.

$$VBL \cdot ref = Vb1h/2 - \{Cs/(Cb+Cs)\}(\Delta v/2) \quad (7)$$

Therefore, the levels of the bit line read signals at "H" and "L" levels are equalized.

Next, a fourth embodiment of the present invention will be described with reference to FIG. 11 described above.

One dummy cell each of write type capacity 2Cs (=Cd) having the cell transistor whose gate is the dummy word line is connected to the signal read bit line and the reference bit line.

By such a constitution, in the system in which the bit line "H" potential (Vb1h) is set more highly than a possible maximum value (Vsn(1)max) of the memory cell "H" potential specified by the word line boot voltage during the sense amplification in the read operation, the precharge potential is provided during equalizing and the dummy word line corresponding to the reference bit line is also driven during selecting the word line, whereby the levels of the bit line read signals at "H" and "L" levels are equalized. In FIG. 11, the setting of the potential associated with the memory cell is accomplished in the same manner as the second embodiment. In the fourth embodiment, the dummy cell capacity Cd is two times the memory cell capacity (that is, it is equal to 2Cs), and the write precharge potential Vdc is expressed by the following equation (8).

$$Vdc = Vdc2 = 1/2\{Vb1h - \Delta V \cdot (Cb+2Cs)/2(Cb+Cs)\} \quad (8)$$

The above-mentioned potential Vdc2 is generated by the power source generating circuit shown in FIG. 12. That is, the potential Vdc2 is achieved by the circuit for dividing the potential (Vb1h−ΔV) (shown in detail in FIG. 13(b)). The dummy word line is formed so that it may be driven by the constitution of FIG. 7 in the same manner as the word line. For example, the dummy word line DWL12 is also driven when the word line WL1 is driven, while the dummy word line DWL03 keeps the ground potential. Thus, at the time of read the signal, the reference bit line potential VBL.ref is shifted in the same manner as the third embodiment described above, so that the levels of the bit line read signals at "H"0 and "L" levels are equalized. The constitution in which the dummy cell capacity Cd is two times the memory cell capacity (2Cs) has an advantage in which there is no irregularity in cell layout.

Next, a fifth embodiment of the present invention will be described with reference to FIG. 11 described above.

One dummy cell each of write type capacity nCs (=Cd) having the cell transistor whose gate is the dummy word line is connected to the signal read bit line and the reference bit line.

By such a constitution, in the system in which the bit line "H" potential (Vb1h) is set more highly than a possible maximum value (Vsn(1)) of the memory cell "H" potential specified by the word line boot voltage during the sense amplification in the read operation, the precharge potential is provided during equalizing and the dummy word line corresponding to the reference bit line is also driven during selecting the word line, whereby the levels of the bit line read signals at "H" and "L" levels are equalized. In FIG. 7, the setting of the potential associated with the memory cell is accomplished in the same manner as the second embodiment. In the fifth embodiment, the dummy cell capacity Cd is n times the memory cell capacity (that is, it is equal to nCs), and the write precharge potential Vdc is expressed by the following equation (9).

$$Vdc = Vdcn = 1/2\{Vb1h - \Delta V \cdot (Cb+nCs)/n(Cb+Cs)\} \quad (9)$$

The above-mentioned potential Vdcn is generated by the power source generating circuit shown in FIG. 12. That is, the potential Vdcn is achieved by the circuit for dividing the potential (Vb1h−ΔV) (shown in detail in FIG. 13(b)). The dummy word line is formed so chat it may be driven by the constitution of FIG. 7 in the same manner as the word line. For example, the dummy word line DWL12 is also driven when the word line WL1 is driven, while the dummy word line DWL03 keeps the ground potential. Thus, at the time of read the signal, the reference bit line potential VBL.ref is shifted in the same manner as the third embodiment described above, so that the levels of the bit line read signals at "H" and "L" levels are equalized.

FIGS. 13(a) and 13(b) are circuit diagrams showing the exemplary constitution of FIG. 12. FIG. 13(a) shows the circuit for outputting the potential Vdc1 according to the third embodiment. FIG. 13(b) shows the circuit for outputting the potentials Vdc2 to Vdcn according to the fourth and fifth embodiments. As shown in FIG. 12, any constitution is composed of a (Vb1h−ΔV) potential generating circuit 41 and a dividing circuit 42.

The (Vb1h−ΔV) potential generating circuit 41 makes the potential, which is obtained by the subtraction of ΔV from the bit line "H" potential Vb1h, by means of the two same transistor cell 1, cell 2 as the cell transistor for supplying the word line "H" potential to the gate. Then, the circuit 41 inputs a corresponding signal output from an amplifier A1 no the gate of a P-channel MOS transistor PT1. By a gate control of this transistor PT1, the (Vb1h−ΔV) potential is generated from the internal power source Vint. The amplifier A1 is feed-back controlled by the use of its non-inverting input terminal and transfers the stabilized (Vb1h−ΔV) potential to the dividing circuit 42.

The dividing circuit 42 divides the (Vb1h−ΔV) potential into predetermined potentials by the use of dividing resistors R1, R2 (or R3 to R6). Then, by the feed-back control of an amplifier A2 and by the gate control of a P-channel MOS transistor PT2, a predetermined stabilized potential Vdc1 (or Vdcn) is output. A relationship between the dividing resistors R1 and R2 or between R3 and R4 or between R5 and R6 is shown in the drawing (where Cb denotes the capacity of the bit line, Cs denotes the storage capacity of the memory cell, and n=2, 3, 4, . . . ). According to the above-described embodiments, both of the "H" and "L" levels of the bit line read signals obtained during selecting the word line are represented by the following equation (10).

$$Cs/(Cb+Cs) \cdot (Vb1h/2-V/2) \qquad (10)$$

On the other hand, the reference bit line potential is expressed by the following equation (11).

$$1/2Vb1h-Cs/(Cb+Cs) \cdot \Delta V/2 \qquad (11)$$

In other words, during the amplification, the bit line "H" potential is set not to the maximum value of the memory cell "H" potential specified by the word line boot voltage tending to be reduced but to the larger value, whereby the reference bit line potential is increased without changing the level of the bit line read signal. That is, this is expressed by the following equation (12).

$$1/2Vb1h-Cs/(Cb+Cs) \cdot \Delta V/2 \qquad (12)$$

Therefore, the sense speed is also increased. As a result, the present invention can contribute to both of the reduction of voltage and the high-speed operation.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A semiconductor memory comprising:
    a memory cell array composed of a matrix arrangement of memory cells, each being composed of a storage device, which are selectively controlled by a word line control signal and a bit line control signal supplied to a word line and a bit line at a predetermined timing;
    a voltage boosting circuit for boosting the potential of the word line selected by supplying said word line control signal up to a first potential which is higher than an internal power source potential;
    a potential generating circuit for setting the potential of the bit line, which is selected by supplying said bit line control signal, to a second potential which is higher than the potential that is lower than said first potential by a threshold voltage of said memory cell; and
    a sense amplifier operated by using said second potential as an operating power source and for amplifying a potential difference between a reference bit line and a read bit line to which data stored in said selectively controlled memory cell is transmitted.

2. The semiconductor memory according to claim 1, further comprising:
    a control circuit for adjusting, when said sense amplifier circuit is operated, so as to equalize the potential difference between the read bit line and the reference bit line at both of the time when the stored data is read at an "H (high level)" potential and the time when the stored data is read at an "L (low level)" potential.

3. The semiconductor memory according to claim 1, further comprising:
    an intermediate potential generating circuit for generating an intermediate potential between said second potential and an ground potential and for supplying the intermediate potential to a dummy word line drive circuit and an equalizing circuit.

4. A semiconductor memory comprising:
    a memory cell array;
    voltage decreasing means for generating an internal power source potential by decreasing the voltage of an external power source;
    voltage boosting means for generating a first potential which is higher than said internal power source potential; and
    a bit line high potential generating circuit for generating, from said internal power source potential, a second potential which is higher than the potential that is lower than said first potential by the threshold voltage of the memory cell in said memory cell array.

5. The semiconductor memory according to claim 4, further comprising:
    an intermediate potential generating circuit for generating an intermediate potential between said second potential and the ground potential and for supplying the intermediate potential to the dummy word line drive circuit and the equalizing circuit.

6. A semiconductor memory comprising:
    a memory cell array composed of a matrix arrangement of memory cells, which are selectively controlled by supplying a word line control signal and a bit line control signal to a word line and a bit line at a predetermined timing;
    a sense amplifier circuit for amplifying the potential difference between the reference bit line and the read bit line to which the data stored in said memory cell is transmitted;
    a dummy word line and a dummy cell included in said memory cell array and driven for generating the reference bit line potential during read the data stored in said memory cell; and
    a control circuit for providing a voltage change for said dummy word line when the data stored in said memory cell is read to the bit line by selecting the word line by said word line control signal, and said control circuit for equalizing the potential difference between the read bit line and the reference bit line at both of the time when the stored data is read at the "H (high level)" potential of said memory cell and the time when the stored data is read at the "L (low level)" potential of said memory cell.

7. The semiconductor memory according co claim 6, wherein the reference bit line potential obtained by said control circuit is larger than a half of the "H" potential of said memory cell.

8. The semiconductor memory according to claim 6, wherein said dummy cell has a capacity obtained by simply coupling the capacity of said dummy word line and the capacity of said bit line.

9. The semiconductor memory according to claim 6, wherein said dummy cell is in the form of a precharge having a cell transistor whose gate is said dummy word line, and a precharge potential is generated by said control circuit.

10. The semiconductor memory according to claim 8, wherein said dummy cell is composed of a gate capacity.

11. The semiconductor memory according to claim 8, wherein said dummy cell is composed of a memory cell.

12. A semiconductor memory comprising:
a memory cell having a dummy word line and a dummy cell;
a word line drive circuit; and
a dummy word line drive circuit for equalizing the bit line read signal amounts at "H" and the bit line read signal amounts at "L" by shifting the potential of the dummy word line corresponding to the word line selected by said word line drive circuit.

13. The semiconductor memory according to claim 12, wherein:
the potential of said dummy word line is shifted, whereby the reference bit line potential is shifted to the value represented by the following equation:

$$\frac{Vblh}{2} - \frac{Cs}{Cb+Cs} \cdot \frac{\Delta Vdw11 + \Delta Vdw12}{2}$$

where Vb1h/2 denotes a reference bit line potential, $\Delta Vdw11$ denotes a potential change for one of the dummy word lines, $\Delta Vdw12$ denotes a potential change for another dummy word line, Cb denotes a capacity of the bit line, and Cs denotes a storage capacity of the memory cell.

14. The semiconductor memory according to claim 12, wherein said dummy word line drive circuit has a transistor of the same threshold voltage as the threshold voltage of said memory cell.

15. A semiconductor memory comprising:
a memory cell array composed of a matrix arrangement of memory cells, each being composed of a storage device, which are selectively controlled by supplying a word line control signal of a first potential and a bit line control signal of a second potential, that is higher than the potential which is lower than said first potential by the threshold voltage of said memory cell, to a word line and a bit line at a predetermined timing;
a sense amplifier circuit operated by using, as the operating power source, said second potential and said sense amplifier circuit for amplifying the potential difference between the reference bit line and the read bit line to which the data scored in said memory cell is transmitted;
a dummy word line and a dummy cell included in said memory cell array and driven for generating the reference bit line potential during read the data stored in said memory cell; and
a control circuit for providing the voltage change for said dummy word line when the data stored in said memory cell is read to the bit line by selecting the word line by said word line control signal, and said control circuit for equalizing the potential difference between the read bit line and the reference bit line at both of the time when the stored data is read at the "H (high level)" potential of said memory cell and the time when the stored data is read at the "L (low level)" potential of said memory cell,
wherein, as regards said dummy word line and dummy cell, each bit line includes two dummy cells of a half (Cs/2) of a storage capacity Cs of said memory cell and two dummy word lines arranged with the two dummy cells,
when the amplification is done by said sense amplifier circuit, it is assumed that $\Delta V$ denotes a level of voltage obtained by subtracting said memory cell "H" potential, which is lower than said second potential from the bit line "H" potential specified by said second potential, and
when the word line is selected, the two dummy word lines corresponding to said read bit line are set to floating level, so that the potentials of the two dummy word lines corresponding to said reference bit line are changed by said control circuit, whereby the sum of both the changes is set to $-\Delta V$.

16. The semiconductor memory according to claim 15, wherein, when the amplification is done by said sense amplifier circuit, the precharge potential of four dummy word lines corresponding to a pair of said bit lines is equal to a bit line equalizing potential which is a half of said bit line "H" potential, and
when said word line is selected, by said control circuit, one of the two dummy word lines corresponding to said reference bit line is set to the ground potential, while the other of the two dummy word lines is set to said memory cell "H" potential.

17. The semiconductor memory according to claim 16, wherein the same cell transistor as said memory cell is used in order to generate said memory cell "H" potential.

18. The semiconductor memory according to claim 16, wherein said dummy cell is in the form of the precharge having the cell transistor whose gate is said dummy word line, and the precharge potential is generated by said control circuit.

19. The semiconductor memory according to claim 18, wherein:
as regards said dummy word line and dummy cell, said bit line includes one dummy cell each of a storage capacity nCs of said memory cell, the precharge potential of said dummy cell is set to the value given by the following equation:

$$\frac{Vblh}{2} - \frac{\Delta V(Cb+nCs)}{2n(Cb+Cs)}$$

where $-\Delta V = \Delta Vdw11 + \Delta Vdw12$, Vb1h/2 denotes a reference bit line potential, $\Delta Vdw11$ denotes a potential change for one of the dummy word line $\Delta Vdw12$ denotes a potential change for another dummy word line, Cb denotes a capacity of the bit line, and Cs denotes a storage capacity of the memory cell, and
during selecting the word line, the dummy word line corresponding to the reference bit line is selected.

20. The semiconductor memory according to claim 19, wherein, in said equation (1), n=2.

21. The semiconductor memory according to claim 19, wherein, in said equation (1), n=1.

* * * * *